(12) United States Patent
Armangau et al.

(10) Patent No.: US 10,437,474 B1
(45) Date of Patent: Oct. 8, 2019

(54) OVERWRITING COMPRESSED DATA EXTENTS

(71) Applicant: EMC IP Holding Company LLC, Hopkinton, MA (US)

(72) Inventors: Philippe Armangau, Acton, MA (US); Ivan Bassov, Brookline, MA (US); Monica Chaudhary, South Grafton, MA (US); Kamakshi Viswanadha, Lexington, MA (US)

(73) Assignee: EMC IP Holding Company LLC, Hopkinton, MA (US)

(*) Notice: Subject to any disclaimer, the term of this patent is extended or adjusted under 35 U.S.C. 154(b) by 308 days.

(21) Appl. No.: 15/499,206

(22) Filed: Apr. 27, 2017

(51) Int. Cl.
*G06F 3/06* (2006.01)

(52) U.S. Cl.
CPC ............ *G06F 3/0608* (2013.01); *G06F 3/061* (2013.01); *G06F 3/0638* (2013.01); *G06F 3/0653* (2013.01); *G06F 3/0673* (2013.01)

(58) Field of Classification Search
CPC ...... G06F 3/0608; G06F 3/061; G06F 3/0638; G06F 3/0653; G06F 3/0673
USPC ........................................................ 711/154
See application file for complete search history.

(56) References Cited

U.S. PATENT DOCUMENTS

| | | | |
|---|---|---|---|
| 8,615,500 B1* | 12/2013 | Armangau | G06F 16/1752 707/693 |
| 8,745,338 B1* | 6/2014 | Yadav | G06F 3/0619 711/154 |
| 9,122,712 B1 | 9/2015 | Bono et al. | |
| 9,355,112 B1* | 5/2016 | Armangau | G06F 16/1774 |
| 9,612,774 B2 | 4/2017 | Romanovskiy | |
| 9,779,023 B1 | 10/2017 | Armangau et al. | |
| 9,880,743 B1 | 1/2018 | Armangau et al. | |
| 9,880,928 B1 | 1/2018 | Bono et al. | |
| 10,203,897 B1* | 2/2019 | Cheah | G06F 3/0638 |
| 2006/0212672 A1* | 9/2006 | Chandrasekaran | G06F 3/0608 711/171 |

* cited by examiner

*Primary Examiner* — Reginald G Bragdon
*Assistant Examiner* — Aaron D Ho
(74) *Attorney, Agent, or Firm* — BainwoodHuang (57) ABSTRACT

A technique for overwriting compressed data tests whether new data compressed with a first compression procedure fits within spaces provided for previous data. If the compressed new data does not fit, the technique compresses the new data using a second compression procedure. Assuming the second compression procedure reduces the compressed size of the new data to fit the available space, the technique stores the new data in the same location as the previous data. In this manner, overwrites can be accommodated in place without the need to create new mapping metadata.

20 Claims, 4 Drawing Sheets

OVERWRITING COMPRESSED DATA EXTENTS

BACKGROUND

Data storage systems are arrangements of hardware and software that include storage processors coupled to arrays of non-volatile storage devices, such as magnetic disk drives, electronic flash drives, and/or optical drives, for example. The storage processors service storage requests, arriving from host machines ("hosts"), which specify files or other data elements to be written, read, created, deleted, and so forth. Software running on the storage processors manages incoming storage requests and performs various data processing tasks to organize and secure the data elements stored on the non-volatile storage devices.

Some data storage systems employ data compression to improve storage efficiency. For example, a software program running on a data storage system may read data from disk, compress the data, and write the compressed data back to disk. To read data that has already been compressed, the program may work in the opposite direction, e.g., by fetching compressed data from disk, decompressing the data, and presenting the decompressed data to a requesting program.

SUMMARY

Data storage systems that employ compression generally do so in the background, such as by running a background process or daemon that acts upon already-stored data. Performing compression in the background may result in an over-commitment of storage resources, however, as more storage space than ultimately needed may be used to accommodate initial writes. Also, background compression may entail reading previously-written data from persistent storage and rewriting compressed data back to persistent storage, resulting in a significant increase in disk traffic.

Recent improvements in data storage systems perform data compression in line with storage requests, such that incoming data are compressed prior to the first time they are stored on disk. This arrangement helps to avoid over-commitment of storage resources and to avoid increases in disk traffic.

Inline compression can present new challenges, however. For example, a data storage system may store inline-compressed data elements in extents of variable size, which are just big enough to accommodate the compressed data elements they store. If a client program makes a change to a data element after its initial inline compression and storage, the new compressed data element may not fit in the space provided for the original data element. For example, the new data element may not be as compressible as was the original data element, such that its compressed size may be larger than that of the original data element. Situations where new compressed data does not fit in spaces provided for previous compressed data can place burdens on storage systems, as new space must be provided somewhere in the storage systems to accommodate the new compressed data. For instance, providing new space in a data storage system may initiate a chain of activities, which may include allocating new blocks, storing new data in the new blocks, and creating new metadata structures that track the new blocks. Although the impact of these activities is small for individual cases, the effects can accumulate in systems that perform many overwrites. For example, such activities can slow down processing of reads and writes and can decrease storage efficiency, on account of the new mapping metadata needed to support the new blocks. Reduction in storage efficiency cuts against a main reason for performing inline compression, which is to improve storage efficiency.

In contrast with approaches that merely relocate compressed data for overwrites when new data does not fit in available space, an improved technique tests whether new data compressed with a first compression procedure fits within spaces provided for previous data. If the compressed new data does not fit, the improved technique compresses the new data again using a second compression procedure. Assuming the second compression procedure reduces the compressed size of the new data to fit the available space, the technique stores the new data in the same location as the previous data. In this manner, overwrites can be accommodated in place without the need to create new mapping metadata. A data storage system implementing this technique thus benefits from higher performance and improved storage efficiency.

Certain embodiments are directed to a method of overwriting compressed data in a data storage system. The method includes receiving an IO (Input/Output) request specifying a write of new data to a specified logical address of a file within a file system, the file already storing previous data at the specified logical address such that the write of the new data is an overwrite. The method further includes compressing the new data using a first compression procedure and performing a testing operation. The testing operation is configured to generate a first result when the compressed new data fits within a space currently occupied by the previous data and to produce a second result otherwise. In response to the testing operation producing the second result, the method further includes (i) compressing the new data using a second compression procedure and (ii) storing the new data as compressed using the second compression procedure within the space currently occupied by the previous data.

Other embodiments are directed to a data storage system constructed and arranged to perform a method of overwriting compressed data, such as the method described above. Still other embodiments are directed to a computer program product. The computer program product stores instructions which, when executed on control circuitry of a data storage system, cause the data storage system to perform a method of overwriting compressed data, such as the method described above.

The foregoing summary is presented for illustrative purposes to assist the reader in readily grasping example features presented herein; however, the foregoing summary is not intended to set forth required elements or to limit embodiments hereof in any way. One should appreciate that the above-described features can be combined in any manner that makes technological sense, and that all such combinations are intended to be disclosed herein, regardless of whether such combinations are identified explicitly or not.

BRIEF DESCRIPTION OF THE SEVERAL VIEWS OF THE DRAWINGS

The foregoing and other features and advantages will be apparent from the following description of particular embodiments of the invention, as illustrated in the accompanying drawings, in which like reference characters refer to the same or similar parts throughout the different views.

DETAILED DESCRIPTION OF THE INVENTION

Embodiments of the invention will now be described. It should be appreciated that such embodiments are provided by way of example to illustrate certain features and principles of the invention but that the invention hereof is not limited to the particular embodiments described.

An improved technique for overwriting compressed data tests whether new data compressed with a first compression procedure fits within spaces provided for previous data. If the compressed new data does not fit, the improved technique compresses the new data again using a second compression procedure. Assuming the new data fits, the technique stores the new data as compressed using the second compression procedure in the same location as the previous data.

Figure 1:
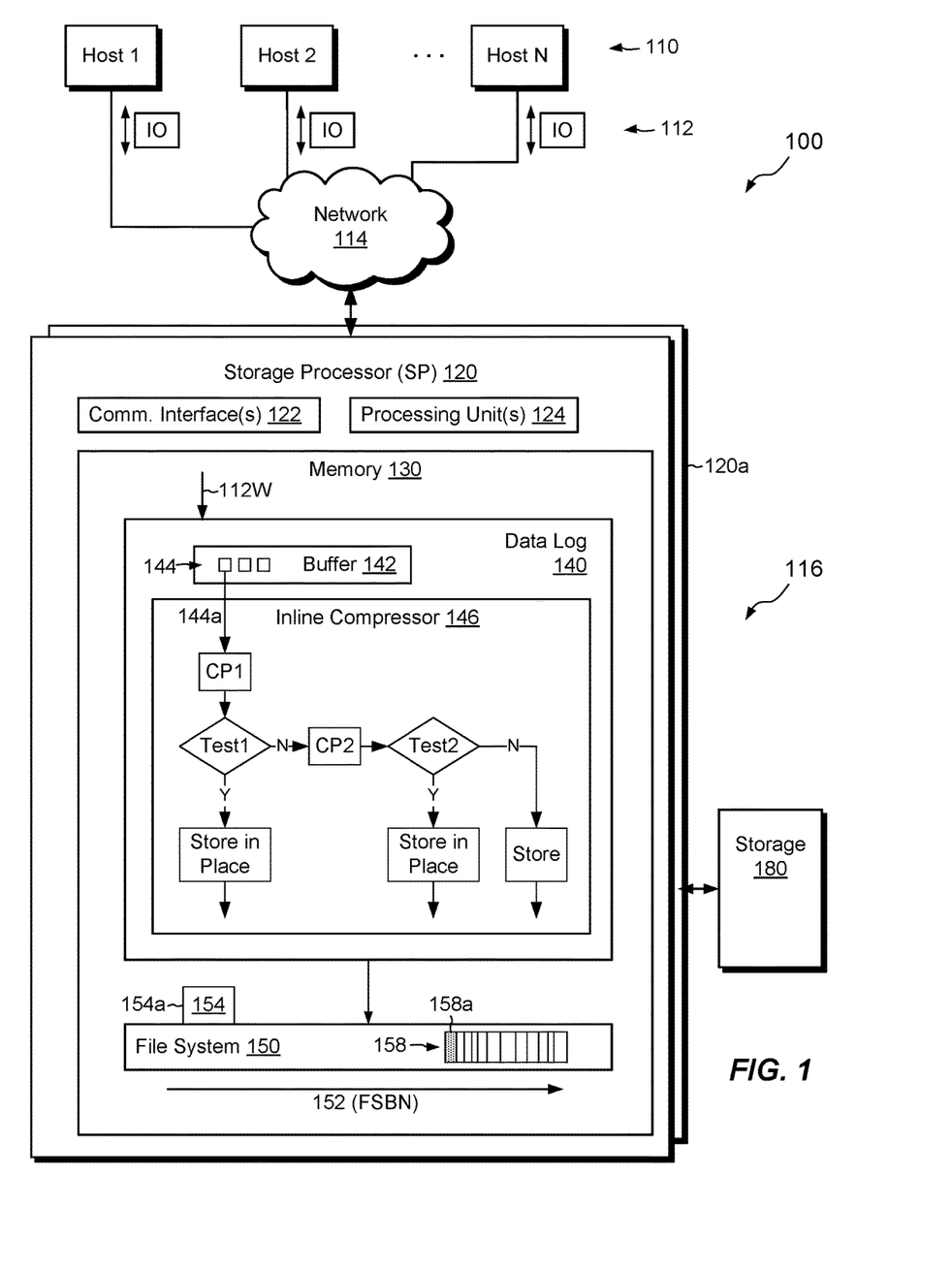
FIG. 1 is a block diagram of an example environment in which embodiments of the improved technique hereof can be practiced.

FIG. 1 shows an example environment 100 in which embodiments of the improved technique hereof can be practiced. Here, multiple host computing devices ("hosts") 110 access a data storage system 116 over a network 114. The data storage system 116 includes a storage processor, or "SP," 120 and storage 180. In an example, the storage 180 includes multiple disk drives, such as magnetic disk drives, electronic flash drives, optical drives, and/or other types of drives.

The data storage system 116 may include multiple SPs like the SP 120 (e.g., a second SP 120a). In an example, multiple SPs may be provided as circuit board assemblies, or "blades," which plug into a chassis that encloses and cools the SPs. The chassis has a backplane for interconnecting the SPs, and additional connections may be made among SPs using cables. It is understood, however, that no particular hardware configuration is required, as any number of SPs may be provided, including a single SP, and the SP 120 can be any type of computing device capable of processing host IOs.

The network 114 may be any type of network or combination of networks, such as a storage area network (SAN), a local area network (LAN), a wide area network (WAN), the Internet, and/or some other type of network or combination of networks, for example. The hosts 110 may connect to the SP 120 using various technologies, such as Fibre Channel, iSCSI, NFS, and CIFS, for example. Any number of hosts 110 may be provided, using any of the above protocols, some subset thereof, or other protocols besides those shown. As is known, Fibre Channel and iSCSI are block-based protocols, whereas NFS and CIFS are file-based protocols. The SP 120 is configured to receive IO requests 112 according to block-based and/or file-based protocols and to respond to such IO requests 112 by reading or writing the storage 180.

The SP 120 includes one or more communication interfaces 122, a set of processing units 124, and memory 130. The communication interfaces 122 include, for example, SCSI target adapters and network interface adapters for converting electronic and/or optical signals received over the network 114 to electronic form for use by the SP 120. The set of processing units 124 includes one or more processing chips and/or assemblies. In a particular example, the set of processing units 124 includes numerous multi-core CPUs. The memory 130 includes both volatile memory, e.g., RAM (Random Access Memory), and non-volatile memory, such as one or more ROMs (Read-Only Memories), disk drives, solid state drives, and the like. The set of processing units 124 and the memory 130 together form control circuitry, which is constructed and arranged to carry out various methods and functions as described herein. Also, the memory 130 includes a variety of software constructs realized in the form of executable instructions. When the executable instructions are run by the set of processing units 124, the set of processing units 124 are caused to carry out the operations of the software constructs. Although certain software constructs are specifically shown and described, it is understood that the memory 130 typically includes many other software constructs, which are not shown, such as an operating system, various applications, processes, and daemons.

As further shown in FIG. 1, the memory 130 "includes," i.e., realizes by operation of software instructions, a data log 140 and a file system 150. The data log 140 includes a buffer 142 and an in-line compressor 146. The file system 150 has a physical address space 152, which ranges, for example, from zero to some large number. The physical address space 152 is denominated in blocks, with each block address identified by File System Block Number, or "FSBN." A "block" is typically the smallest unit of storage space that the file system 150 can allocate. Blocks in file system 150 are normally uniform in size, with typical block sizes being 4 KB or 8 KB, for example.

The file system 150 stores a segment 158, which may be composed of multiple contiguous blocks, i.e., blocks having consecutive FSBNs. A typical size of segment 158 may be 8 blocks, which works out to 64 KB for an 8-KB block size. However, the number of blocks in segment 158 may vary. Segment 158 stores extents of compressed data for file 154a, which is designated by inode (index node) 154. Here, segment 158 includes multiple extents of compressed data, including extent 158a (shaded). In an example, inode 154 is a data structure, stored in one or more blocks of file system 150, which includes information about the file 154a, such as it size and ownership. Inode 154 also stores pointers to data of the file 154a. For example, inode 154 stores direct pointers to data blocks and/or to indirect blocks (IBs), which themselves store arrays of pointers to data of the file 154a. IBs may be arranged in multiple layers, forming an IB tree, and IBs that point directly to data blocks of a file are called "leaf Ms." File system 150 may include additional metadata structures, which, together with the IBs, form metadata paths to compressed data in segment 158.

One should appreciate that the file system 150 may include any number of files, each having a respective inode, and any number of segments for each file. FIG. 1 shows only a single file 154a and a single segment 158 for simplicity.

The file 154a has a logical address range, with different logical addresses corresponding to different offsets into the file. Logical addresses may be provided in block-sized increments. For instance, each logical address of file 154a may represent an 8 KB increment of storage, assuming a file-system block size of 8 KB. Each increment that corresponds to a logical address may be referred to herein as a "logical block." File system metadata maps logical blocks of files to corresponding physical blocks in the physical address space 152.

In cases where inline compression is performed, the file system 150 may map each logical block to a corresponding extent in a segment (such as segment 158). Each extent is typically smaller than a physical block, with the size of each extent reflecting the amount of compression achieved.

In example operation, hosts 110 issue IO requests 112 to the data storage system 116. The IO requests 112 direct the data storage system 116 to perform reads and writes of one or more data objects. SP 120 receives the IO requests 112 at communication interface(s) 122 and passes them to memory 130 for further processing. Some of the IO requests 112 specify data writes 112W to file 154a. Buffer 142 receives the data writes 112W and stores the specified data within block-sized increments 144. The buffer 142 may be implemented in non-volatile memory, such as DRAM (Dynamic Random Access Memory), and the DRAM may be battery-backed and/or mirrored to SP 120a, such that the data are deemed persisted once they are stored in buffer 142. SP 120 may acknowledge completion of IO requests 112W back to hosts 110 once the data are stored in buffer 142.

In-line compressor 146 receives host data from block-sized increments 144 in buffer 142, compresses the data, and flushes the compressed data to the file system 150 for storage at mapped locations. FIG. 1 shows particular logic for managing overwrites of compressed data. Here, the inline compressor 146 receives new data from a block-sized increment 144a. The data specifies an overwrite of file 154a at a particular logical address, which the file system 150 already maps to extent 158a. Extent 158a thus already stores data that was previously written at the same logical address as the one to which the current overwrite is directed.

In accordance with the illustrated logic, inline compressor 146 compresses the new data from increment 144a using a first compression procedure (or algorithm) CP1. Test1 then compares the size of the compressed new data with the available size, which in this case is the size of the space that stores extent 158a. If the size of the compressed data does not exceed the size of the space for extent 158a, Test1 generates a first result (Yes) and directs the file system 150 to store the new compressed data in place, i.e., in place of the data currently stored in extent 158a. However, if the size of the compressed data exceeds the size of the space for extent 158a, Test1 generates a second result (No), whereupon the inline compressor 146 attempts a second compression of the new data from increment 144a using CP2, a compression procedure different from CP1. CP2 is generally more aggressive than CP1 and may require additional time and/or computational resources to perform. Test2 then compares the compressed size with available size (the size of space for extent 158a). If the compressed size does not exceed the available size, the inline compressor 146 directs the file system 150 to store the new data, as compressed using CP2, in place of the previous data. Otherwise, the inline compressor 146 may try yet another, even more aggressive compression procedure, or it may bail out and simply store the new data elsewhere. In any case, storage of the new, compressed data from increment 144a is preferably the first storage of such data in the file system 150. Thus, data specifying overwrites are preferably compressed inline.

One should appreciate that the success rate of Test2 is generally high, as the new data being written is often of the same type as the data that it replaces at the same logical address. For example, if previous data is compressed text, the new data will likely also be compressed text, as it corresponds to the same location of the same file. The more aggressive compression of CP2 versus CP1 thus has a high likelihood of producing compressed data that fits in the available space, as it is compressing similar data more aggressively.

Compression procedures CP1 and CP2 may be implemented in any suitable way. For example, they may be realized using software, using hardware (e.g., as specialized chips or assemblies), or using a combination of software and hardware. Example software compression procedures include LZ (Lempel-Ziv) and LZH (Lempel-Ziv, and Haruyasu) compressors. For instance, CP1 may be implemented using LZ-L3 and CP2 may be implemented using LZH-L4. These are merely examples, however.

Figure 2:
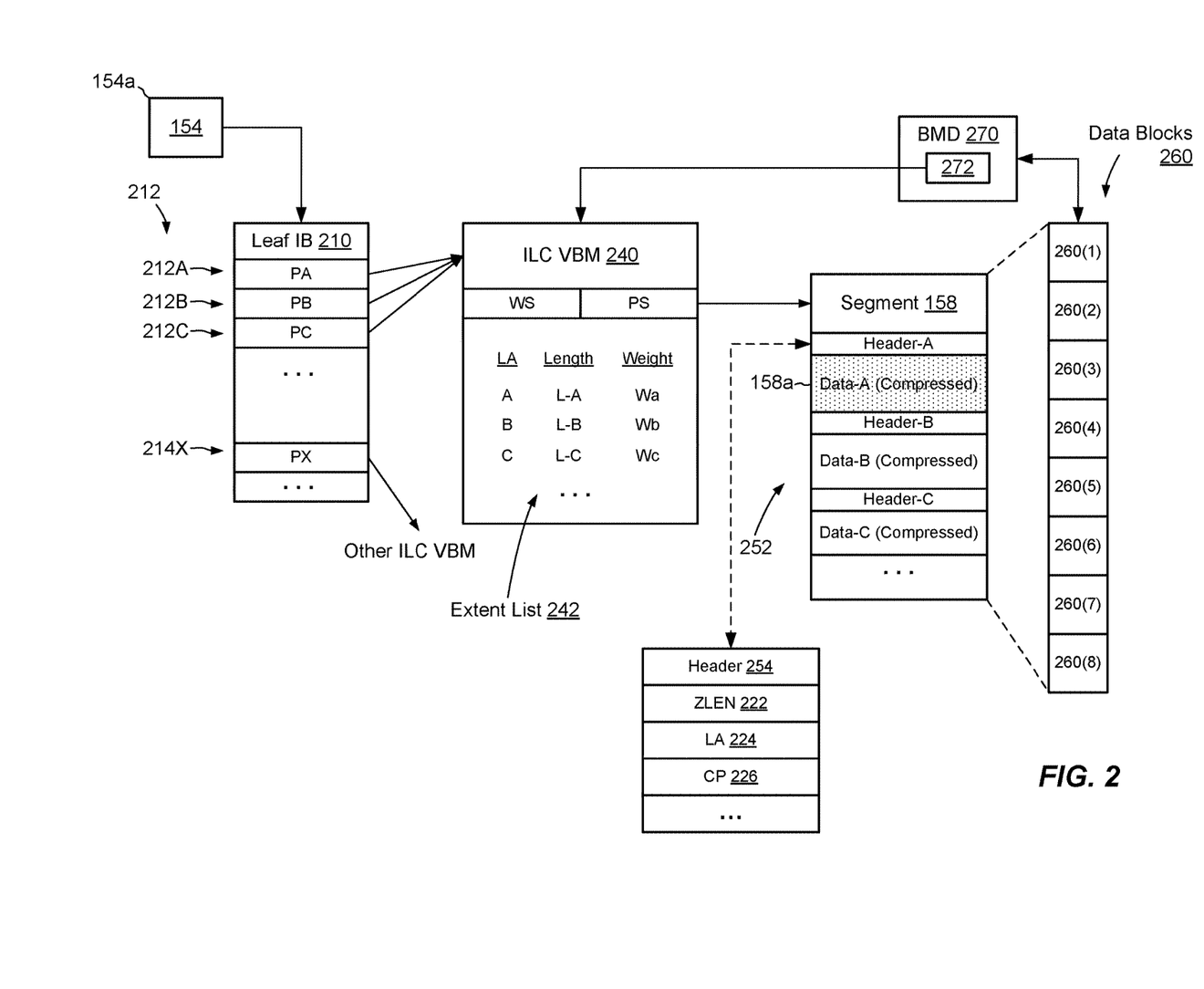
FIGS. 2 and 3 are block diagrams showing an example metadata arrangement that supports storage of compressed data in a file system of FIG. 1, before (FIG. 2) and after (FIG. 3) storage in place of new data that overwrites previous data.

FIG. 2 shows example file system metadata structures that support mapping to extents of compressed data in segment 158, prior to any overwrite of data in extent 158a. The metadata structures include inode 154, leaf IB (Indirect Block) 210, and a VBM (virtual block map), such as ILC (in-line compression) VBM 240. Leaf IB 210 includes block pointers 212, which map logical addresses of the file 154a to corresponding physical addresses (FSBNs) in the file system 150. For example, block pointer 212A maps logical address A, block pointer 212B maps logical address B, and block pointer 212C maps logical address C. Each logical address (A, B, or C) describes a block-sized increment of storage in file 154a, even though the underlying data may be compressed to much less than the size of a block.

Leaf IB 210 may include additional block pointers 212 (e.g., a total of 10, 16, 20, 21, etc.) that all point to ILC VBM 240 for addressing respective extents of compressed data in segment 158. Leaf IB 210 may store additional block pointers, such as pointer 214X, which point to other segments via other ILC VBMs. Leaf IB 210 may also store pointers (not shown) that point to uncompressed blocks. Leaf IB 210 may include any number of block pointers, a typical number being 1024.

In the example shown, pointers 212 in leaf IB 210 all point to ILC VBM 240. ILC VBM 240 has a weight WS and a pointer PS. The weight WS indicates the number of block pointers (e.g., 212) that point to the ILC VBM 240, and the pointer PS points to the physical address (FSBN) of the segment 158, which by convention may be selected to be the address of the first data block in segment 158, i.e., 260(1). The ILC VBM 240 also has an extent list 242. Extent list 242 describes the contents of segment 158 and relates, for each extent of compressed data, the logical address (LA) of that item in the file (e.g., A, B, or C), a length (L-A, L-B, or L-C, e.g., in bytes) of that compressed data in the segment 158), and a weight (Wa, Wb, or Wc). In an example, the sum of weights of extents in the extent list 242 equals the total weight WS of the ILC VBM 240.

Segment 158 is composed of contiguous data blocks 260, i.e., blocks 260(1) through 260(8). For purposes of storing compressed data, boundaries between blocks 260(1) through 260(8) may be ignored and the segment 158 may be treated as one continuous space.

In an example, segment 158 has associated per-block metadata (BMD) 270. By convention, the BMD 270 may be provided for the first block 260(1) in segment 158. The file system 150 ensures that BMD 270 has a known location relative to block 260(1), and vice-versa, such that the location of one implies the location of the other. BMD 270 may also store a back-pointer 272 to the ILC VBM 240, i.e., to the particular ILC VBM that maps the compressed data stored in segment 158.

The detail shown in segment 158 indicates an example layout 252 of compressed extents. For instance, Header-A can be found at Loc-A immediately before compressed Data-A. Likewise, Header-B can be found at Loc-B immediately before compressed Data-B. Similarly, Header-C can be found at Loc-C immediately before compressed Data-C.

A compression header 254 is shown for illustration and is intended to be representative of all compression headers in segment 158 (or in any segment). In an example, each compression header 254 is a fixed-size data structure that includes multiple data elements, such as the following:
ZLEN 222: the length of the corresponding extent of compressed data; e.g., in bytes.
LA 224: the logical address (e.g., A, B, C, and so on) of the corresponding extent of compressed data within the file 154a.
CP 226: a compression procedure (or algorithm) used to compress the data, such as LZ-L3, LZH-L4, "Hardware," and so on.
The header 254 may include additional elements, such as CRC (Cyclic Redundancy Check) and various flags. For purposes of this example, we assume that CP 226 is set to CP1, i.e., the first (less aggressive) procedure described in connection with FIG. 1.

Figure 3:
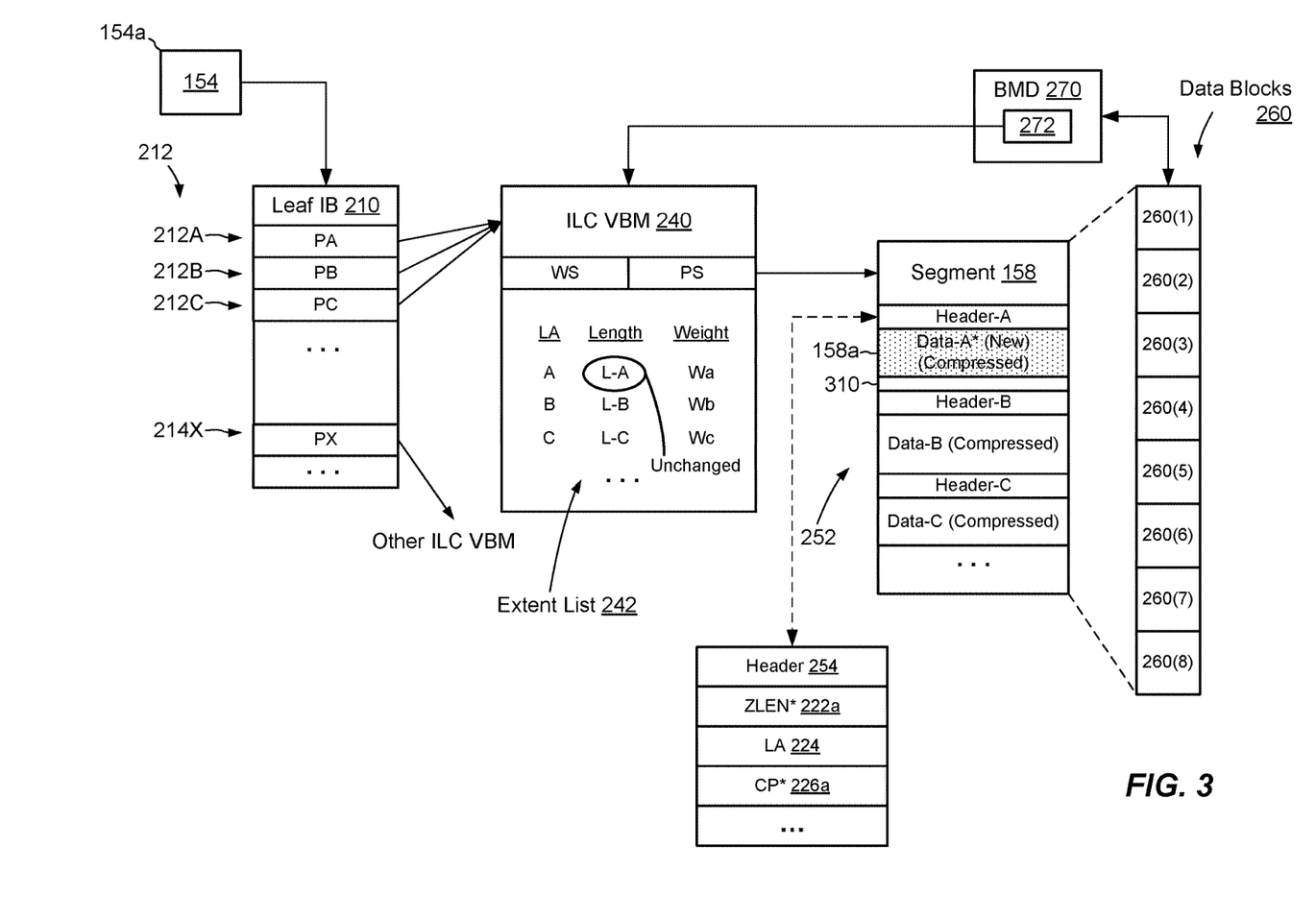

FIG. 3 shows the same arrangement as FIG. 2, but after an overwrite has been performed. Here, Data-A has been replaced with Data-A*, the new data compressed using CP2, the more aggressive procedure. It can be seen that Data-A* is smaller than Data-A, as the overwrite-in-place has left a gap 310. The header 254 has been updated to reflect the new arrangement. For example, ZLEN* 222a now indicates the actual length of Data-A* after compression with CP2. Also, CP* 228a identifies CP2, i.e., the compression procedure used to generate Data-A*. Logical address (LA) 224 remains the same as before, as Data-A* is mapped to the same logical address as the one to which DATA-A was mapped.

Notably, updating Data-A to Data-A* requires no changes in the metadata structures that map the logical address of Data-A (or Data-A*). For example, no change is required in the inode 154, in the leaf IB 210, or in the ILC VBM 240. Even the length L-A in the extent list 242 remains unchanged. This is the case because the lengths in the extent list 242 are used to locate extents in the segment 158 but are not intended to be true measures of actual compressed lengths, which are instead provided in headers 254.

In some examples, inline compressor 146 uses lengths (e.g., L-A, L-B, L-C) in the extent lists 242 as measures of the size of available space for purposes of Test1 and Test2 (FIG. 1), as these lengths remain constant even as new data having different ZLEN values are written.

It is thus evident that the second compression of new data using CP2 enables overwrites to be performed at high efficiency. Whatever might be sacrificed in CPU (Central Processing Unit) cycles by performing the second compression using CP2 is generally recovered, often many times over, by avoiding disk accesses to metadata structures.

Consuming CPU cycles to perform second compressions is not always inconsequential, however. Sometimes, it may be preferable to avoid second compressions if CPU activity is very high.

Figure 4:
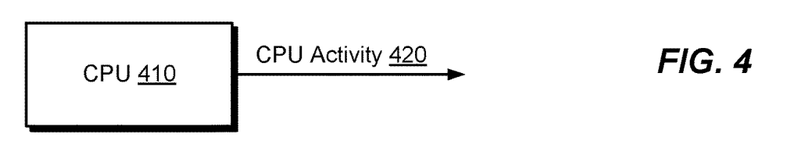
FIG. 4 is a block diagram of an example CPU (Central Processing Unit) that provides an output measure of CPU activity.

FIG. 4 shows an example CPU 410, which is representative of CPUs in the set of processing units 124. Here, CPU 410 provides an output 420 that indicates its level of activity. According to some embodiments, the inline compressor 146 receives the output 420 as a heuristic and selectively changes its operation based on the level of CPU activity. For example, the inline compressor 146 may compare the CPU activity 420 with a threshold. If the CPU activity exceeds the threshold, indicating the CPU activity is at a premium, the inline compressor 146 may temporarily stop performing second compressions. The inline compressor 146 may later resume performing second compressions when the CPU activity falls below the threshold.

Figure 5:
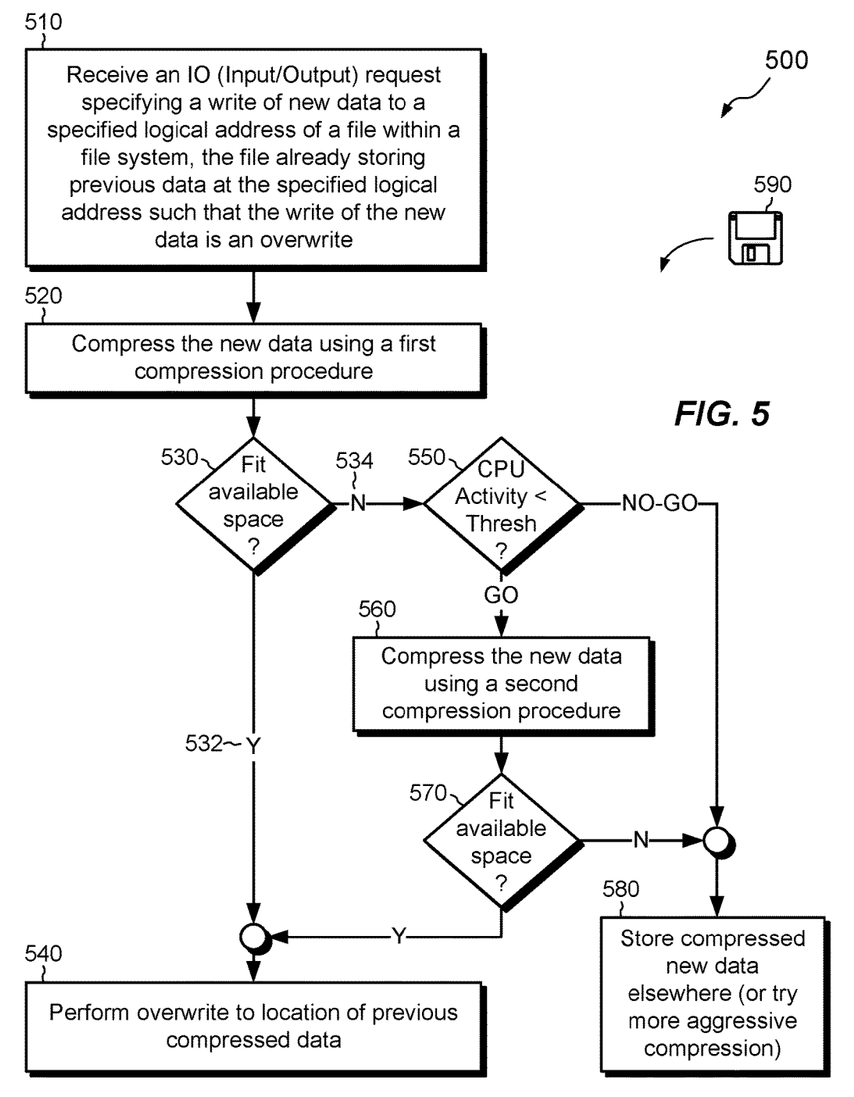
FIG. 5 is a flowchart showing an example method of overwriting compressed data in the data storage system of FIG. 1.

FIG. 5 shows an example method 500 that may be carried out in connection with the environment 100. The method 500 is typically performed, for example, by the software constructs described in connection with FIG. 1, which reside in the memory 130 of the storage processor 120 and are run by the set of processors 124. The various acts of method 500 may be ordered in any suitable way. Accordingly, embodiments may be constructed in which acts are performed in orders different from that illustrated, which may include performing some acts simultaneously.

At 510, an IO (Input/Output) request 112W is received that specifies a write of new data to a specified logical address of a file 154a within a file system 150. The file 154a already stores previous data at the specified logical address such that the write of the new data is an overwrite.

At 520, the new data are compressed using a first compression procedure, such as CP1.

At 530, a testing operation is performed. The testing operation is configured to generate a first result 532 when the compressed new data fits within a space currently occupied by the previous data (e.g., the size of space for compressed extent 158a) and to produce a second result 534 otherwise.

At 540, assuming the testing operation at 530 produced the first result 532, an overwrite is performed at the location of the previous compressed data, e.g., in extent 158a.

Returning to 530, if the testing operation produced the second result 534, an optional test 550 may be performed, which produces a GO result if monitored CPU activity does not exceed a threshold level of CPU activity and produces a NO-GO result otherwise.

If the test 550 produces the GO result, operation proceeds to 560, where the new data is compressed using CP2. At 570, another testing operation checks whether the new data as compressed with CP2 fits in the available space. If so, operation proceeds to 540, where an overwrite is performed at the location of the previous compressed data. In this case, the data being written is the new data as compressed with CP2.

If test 550 produces the NO-GO result, or if testing operation 570 produces a No result, then the file system 150 may store the new data elsewhere, such as in a different extent, different segment, or different block. Alternatively, an even more aggressive compression procedure is performed, providing yet another chance to store the new data in the same location as the previous data.

An improved technique has been described for performing overwrites of compressed data. The technique tests whether new data compressed with a first compression procedure CP1 fits within spaces provided for previous data. If the compressed new data does not fit, the improved technique compresses the new data again using a second compression procedure CP2. Assuming the second compression procedure CP2 reduces the compressed size of the new data to fit the available space, the technique stores the new data in the same location as the previous data. In this manner, overwrites can be accommodated in place without the need to create new mapping metadata. A data storage system implementing this technique thus benefits from higher performance and improved storage efficiency.

Having described certain embodiments, numerous alternative embodiments or variations can be made. For example, although certain metadata structures are shown and described, these are merely examples, as other types of metadata structures may also be used.

Also, although a technique for performing overwrites has been described in connection with inline compression, a similar technique may be used for background compression. Thus, embodiments hereof are limited to inline compression only.

Further, although features are shown and described with reference to particular embodiments hereof, such features may be included and hereby are included in any of the disclosed embodiments and their variants. Thus, it is understood that features disclosed in connection with any embodiment are included as variants of any other embodiment.

Further still, the improvement or portions thereof may be embodied as a computer program product including one or more non-transient, computer-readable storage media, such as a magnetic disk, magnetic tape, compact disk, DVD, optical disk, flash drive, solid state drive, SD (Secure Digital) chip or device, Application Specific Integrated Circuit (ASIC), Field Programmable Gate Array (FPGA), and/or the like (shown by way of example as medium 590 in FIG. 5). Any number of computer-readable media may be used. The media may be encoded with instructions which, when executed on one or more computers or other processors, perform the process or processes described herein. Such media may be considered articles of manufacture or machines, and may be transportable from one machine to another.

As used throughout this document, the words "comprising," "including," "containing," and "having" are intended to set forth certain items, steps, elements, or aspects of something in an open-ended fashion. Also, as used herein and unless a specific statement is made to the contrary, the word "set" means one or more of something. This is the case regardless of whether the phrase "set of" is followed by a singular or plural object and regardless of whether it is conjugated with a singular or plural verb. Further, although ordinal expressions, such as "first," "second," "third," and so on, may be used as adjectives herein, such ordinal expressions are used for identification purposes and, unless specifically indicated, are not intended to imply any ordering or sequence. Thus, for example, a "second" event may take place before or after a "first event," or even if no first event ever occurs. In addition, an identification herein of a particular element, feature, or act as being a "first" such element, feature, or act should not be construed as requiring that there must also be a "second" or other such element, feature or act. Rather, the "first" item may be the only one. Although certain embodiments are disclosed herein, it is understood that these are provided by way of example only and that the invention is not limited to these particular embodiments.

Those skilled in the art will therefore understand that various changes in form and detail may be made to the embodiments disclosed herein without departing from the scope of the invention.

What is claimed is:

1. A method of overwriting compressed data in a data storage system, the method comprising:
   receiving an IO (Input/Output) request specifying a write of new data to a specified logical address of a file within a file system, the file already storing previous data at the specified logical address such that the write of the new data is an overwrite;
   compressing the new data using a first compression procedure;
   performing a testing operation configured to generate a first result when the compressed new data fits within a space currently occupied by the previous data and to produce a second result otherwise; and
   in response to the testing operation producing the second result, (i) compressing the new data using a second compression procedure and (ii) storing the new data as compressed using the second compression procedure within the space currently occupied by the previous data.

2. The method of claim 1, wherein, prior to storing the new data, the previous data was stored along with other compressed data in a segment of blocks laid out contiguously in a physical address space of the file system, and wherein the method further comprises, when storing the new data:
   identifying, within the segment of blocks, a compression header of the previous data; and
   updating the compression header to store an identifier of the second compression procedure.

3. The method of claim 2, wherein the compression header of the previous data also includes a field for storing a compressed length of the previous data, and wherein the method further comprises:
   updating the field for storing the compressed length to a length of the new data as compressed using the second compression procedure.

4. The method of claim 3, wherein the file system includes a set of metadata structures that map the logical address of the previous data to the segment of blocks, and wherein storing the new data is performed without changing any of the set of metadata structures.

5. The method of claim 3,
   wherein the file system includes a set of metadata structures that map the logical address of the previous data to the segment of blocks,
   wherein the set of metadata structures includes a virtual block map (VBM) that stores an extent list and a pointer to the segment of blocks,
   wherein the extent list includes (i) the logical address in the file of the previous data and (ii) a version of the compressed length of the previous data, and
   wherein storing the new data is performed without changing the version of the length of the previous data in the extent list.

6. The method of claim 5, further comprising:
   monitoring CPU (Central Processing Unit) activity of a CPU in the data storage system; and
   performing a CPU activity test configured to produce a GO result in response to CPU activity falling below a predetermined threshold and to produce a NO-GO result otherwise,
   wherein compressing the new data using the second compression procedure is performed in response to the CPU activity test producing the GO result.

7. The method of claim 2, further comprising:
   receiving a second IO request specifying a write of second new data to a second logical address of the file within the file system, the file already storing previous second data at the second logical address;
   compressing the second new data using the first compression procedure;
   performing the testing operation on the compressed second new data; and in response to the testing operation on the compressed second new data producing the second result, storing the compressed second new data at another location in the file system.

8. A data storage system, comprising control circuitry that includes a set of processing units coupled to memory, the control circuitry constructed and arranged to:
receive an IO (Input/Output) request specifying a write of new data to a specified logical address of a file within a file system, the file already storing previous data at the specified logical address such that the write of the new data is an overwrite;
compress the new data using a first compression procedure;
perform a testing operation configured to generate a first result when the compressed new data fits within a space currently occupied by the previous data and to produce a second result otherwise; and
in response to the testing operation producing the second result, (i) compress the new data using a second compression procedure and (ii) store the new data as compressed using the second compression procedure within the space currently occupied by the previous data.

9. The data storage system of claim 8, wherein, prior to storing the new data, the previous data was stored along with other compressed data in a segment of blocks laid out contiguously in a physical address space of the file system, and wherein the control circuitry, when constructed and arranged to store the new data, is further constructed and arranged to:
identify, within the segment of blocks, a compression header of the previous data; and
update the compression header to store an identifier of the second compression procedure.

10. The data storage system of claim 9, wherein the compression header of the previous data also includes a field for storing a compressed length of the previous data, and wherein the control circuitry is further constructed and arranged to:
update the field for storing the compressed length to a length of the new data as compressed using the second compression procedure.

11. The data storage system of claim 10,
wherein the file system includes a set of metadata structures that map the logical address of the previous data to the segment of blocks,
wherein the set of metadata structures includes a virtual block map (VBM) that stores an extent list and a pointer to the segment of blocks,
wherein the extent list includes (i) the logical address in the file of the previous data and (ii) a version of the compressed length of the previous data, and
wherein the control circuitry is constructed and arranged to store the new data without changing the version of the length of the previous data in the extent list.

12. The data storage system of claim 11, wherein the control circuitry is further constructed and arranged to:
monitor CPU (Central Processing Unit) activity of a CPU in the data storage system; and
perform a CPU activity test configured to produce a GO result in response to CPU activity falling below a predetermined threshold and to produce a NO-GO result otherwise,
compress the new data using the second compression procedure in response to the CPU activity test producing the GO result.

13. The data storage system of claim 9, wherein the control circuitry is further constructed and arranged to:
receive a second IO request specifying a write of second new data to a second logical address of the file within the file system, the file already storing previous second data at the second logical address;
compress the second new data using the first compression procedure;
perform the testing operation on the compressed second new data; and
in response to the testing operation on the compressed second new data producing the second result, store the compressed second new data at another location in the file system.

14. A computer program product including a set of non-transitory, computer-readable media having instructions which, when executed by control circuitry of a data storage system, cause the control circuitry to perform a method for overwriting compressed data, the method comprising:
receiving an IO (Input/Output) request specifying a write of new data to a specified logical address of a file within a file system, the file already storing previous data at the specified logical address such that the write of the new data is an overwrite;
compressing the new data using a first compression procedure;
performing a testing operation configured to generate a first result when the compressed new data fits within a space currently occupied by the previous data and to produce a second result otherwise; and
in response to the testing operation producing the second result, (i) compressing the new data using a second compression procedure and (ii) storing the new data as compressed using the second compression procedure within the space currently occupied by the previous data.

15. The computer program product of claim 14, wherein, prior to storing the new data, the previous data was stored along with other compressed data in a segment of blocks laid out contiguously in a physical address space of the file system, and wherein the method further comprises, when storing the new data:
identifying, within the segment of blocks, a compression header of the previous data; and
updating the compression header to store an identifier of the second compression procedure.

16. The computer program product of claim 15, wherein the compression header of the previous data also includes a field for storing a compressed length of the previous data, and wherein the method further comprises:
updating the field for storing the compressed length to a length of the new data as compressed using the second compression procedure.

17. The computer program product of claim 16, wherein the file system includes a set of metadata structures that map the logical address of the previous data to the segment of blocks, and wherein storing the new data is performed without changing any of the set of metadata structures.

18. The computer program product of claim 16,
wherein the file system includes a set of metadata structures that map the logical address of the previous data to the segment of blocks,
wherein the set of metadata structures includes a virtual block map (VBM) that stores an extent list and a pointer to the segment of blocks, wherein the extent list includes (i) the logical address in the file of the previous data and (ii) a version of the compressed length of the previous data, and wherein storing the new data is performed without changing the version of the length of the previous data in the extent list.

19. The computer program product of claim 18, wherein the method further comprises:

monitoring CPU (Central Processing Unit) activity of a CPU in the data storage system; and performing a CPU activity test configured to produce a GO result in response to CPU activity falling below a predetermined threshold and to produce a NO-GO result otherwise, wherein compressing the new data using the second compression procedure is performed in response to the CPU activity test producing the GO result.

20. The computer program product of claim 15, wherein the method further comprises:

receiving a second IO request specifying a write of second new data to a second logical address of the file within the file system, the file already storing previous second data at the second logical address;

compressing the second new data using the first compression procedure;

performing the testing operation on the compressed second new data; and in response to the testing operation on the compressed second new data producing the second result, storing the compressed second new data at another location in the file system.

* * * * *